(12) United States Patent
Yamaoka et al.

(10) Patent No.: US 8,633,684 B2
(45) Date of Patent: Jan. 21, 2014

(54) DETECTION SYSTEM, SEMICONDUCTOR DEVICE, AND DATA PROCESSING DEVICE

(75) Inventors: Masanao Yamaoka, White Plains, NY (US); Kenichi Osada, Tokyo (JP); Minoru Motoyoshi, Ome (JP); Tetsuya Fukuoka, Hamura (JP)

(73) Assignee: Hitachi, Ltd., Tokyo (JP)

( * ) Notice: Subject to any disclaimer, the term of this patent is extended or adjusted under 35 U.S.C. 154(b) by 494 days.

(21) Appl. No.: 12/917,523

(22) Filed: Nov. 2, 2010

(65) Prior Publication Data
US 2011/0115474 A1    May 19, 2011

(30) Foreign Application Priority Data

Nov. 13, 2009    (JP) .................................. 2009-259429

(51) Int. Cl.
*G01R 5/14* (2006.01)
(52) U.S. Cl.
USPC ....................................................... 324/140 R
(58) Field of Classification Search
USPC ............... 324/115, 252, 719, 762.01, 762.02, 324/762.05, 765; 702/60
See application file for complete search history.

(56) References Cited

U.S. PATENT DOCUMENTS

| | | | | |
|---|---|---|---|---|
| 6,765,432 B2 * | 7/2004 | Mitsui | ........................... | 327/544 |
| 6,963,477 B2 * | 11/2005 | Ikeda | ............................. | 361/106 |
| 7,082,579 B2 | 7/2006 | Asai | | |
| 7,256,599 B2 * | 8/2007 | Matsuno | .................... | 324/750.3 |
| 7,383,138 B2 * | 6/2008 | Ito et al. | ........................... | 702/60 |
| 2003/0063437 A1 * | 4/2003 | Kurihara | ....................... | 361/688 |

FOREIGN PATENT DOCUMENTS

| | | |
|---|---|---|
| JP | 2003-108241 A | 4/2003 |
| JP | 2006-318513 A | 11/2006 |

* cited by examiner

*Primary Examiner* — Tung X Nguyen
(74) *Attorney, Agent, or Firm* — Miles & Stockbridge P.C.

(57) ABSTRACT

To provide an LSI having a low power mode that can prevent an apparatus on which the LSI is mounted from resulting in performance degradation, etc. even when its electric power is not reduced in the low power mode. Devised is a circuit that instructs an operation mode and detects whether the LSI operates as specified by the mode, and that measures a current at the time of the low power mode in a pseudo manner and, if despite having shifted to the low power mode, the current is not reduced actually, issues an alarm signal.

23 Claims, 11 Drawing Sheets

DETECTION SYSTEM, SEMICONDUCTOR DEVICE, AND DATA PROCESSING DEVICE

CLAIM OF PRIORITY

The present application claims priority from Japanese patent application JP 2009-259429 filed on Nov. 13, 2009, the content of which is hereby incorporated by reference into this application.

FIELD OF THE INVENTION

This invention relates to a semiconductor device constructed with a system having a low power mode of reducing a consumed electric power formed on a semiconductor substrate and a data processing device constructed with the system mounted on its device enclosure, or a data processing device with a semiconductor integrated circuit constituting the system installed on a board, and more specifically, to a semiconductor device having a function of outputting a signal indicating, when the low power mode is not operating normally, that it does not operate normally from the system, and a data processing device.

BACKGROUND OF THE INVENTION

Conventionally, as a technology of reducing a power consumption in the data processing device, there was one that reduces a power consumption of the LSI by interrupting a power source inside the LSI (for example, refer to JP-A-2006-318513).

In addition, conventionally, as a technology of reducing the power consumption in the data processing device, there was one that reduces the power consumption of the LSI by altering a clock frequency supplied to the LSI (for example, refer to U.S. Pat. No. 7,082,579).

Still in addition, as a technology of cooling a data processing device having a semiconductor chip whose calorific power is large, conventionally there was one than adjusts a cooling capacity of cooling means by outputting a cooling means control signal depending on a power source variation signal that was outputted when the power source supplied to the semiconductor chip varied (for example, refer to US2003/0063437).

Even in addition, as a temperature detection circuit provided in the semiconductor chip, there was a technology whereby a signal was outputted before thermal shutdown was activated and an outside microcomputer etc. was enabled to use it by specifying a signal outputted by a temperature detection circuit in response to a detection temperature to be two-stage signals that corresponds to two-stage temperatures (for example, refer to JP-A-2003-108241).

SUMMARY OF THE INVENTION

In recent years, the power consumption of data processing devices increases and the power consumption poses a problem. Especially, the power consumption of the semiconductor integrated circuit (LSI: Large Scale Integrated circuit) for performing a data processing is increasing year by year in connection with improvement in processing performance and finer microfabrication of a semiconductor manufacturing process for manufacturing the LSI. In order to reduce this increasing power consumption, JP-A-2006-318513 discloses a technology of reducing the power consumption of the LSI by interrupting the power source inside the LSI. U.S. Pat. No. 7,082,579 discloses a technology of decreasing the power consumption of the LSI by altering the clock frequency supplied to the LSI.

An operation of interrupting the power source inside the LSI and an operation of lowering the clock frequency to reduce the electric power that are described above are called the low power mode. When a signal for shifting to the low power mode is generated outside the LSI or inside the LSI and is inputted into a circuit in the LSI, the circuit into which the signal is inputted shifts to the low power mode. Usually, in an apparatus on which the LSI is mounted, a supply capacity of the power source and performance of a cooling device for cooling the LSI are set in consideration of the electric power of the LSI. In doing this, in the case of using the LSI having the low power mode, settings of power source performance and cooling performance are done based on the premise that the LSI can shift to the low power mode and thereby the electric power can be reduced. Therefore, in the case where, although the LSI shifted to the low power mode by a certain factor, the electric power is not reduced actually (does not operate in the low power operation), there arise problems such as: the power source will not be sufficiently supplied because power source performance and the cooling capacity are insufficient, and temperature of the LSI will rise more than assumption. When the power source is not fully supplied, it causes the LSI not to operate normally, and in addition brings about malfunctions of other parts, such as LSIs, mounted on the same board. Further, when the temperature increases, there arises a problem that the LSI deteriorates in performance and the LSI can no longer produce the performance of the LSI that is assumed. Therefore, when the LSI shifted to the low power mode and if the electric power does not decrease, it is necessary to take a measure such as halting the LSI, and exchanging the board on which the LSI is mounted.

Incidentally, although the technologies of US2003/0063437 and JP-A-2003-108241 described above do not aim at reduction of the power consumption and they differs from the present invention primarily in that point, it seems that some relevance exists among them at first sight in terms that a signal is outputted by detecting a variation of the power source of the data processing device or the semiconductor chip or a variation of the temperature thereof. However, both of these technologies have a problem that it is impossible to detect whether a desired action has actually occurred in response to the mode-switching signal, and therefore they should be discriminated clearly from the present invention that solves it. For example, although the technology of US2003/0063437, when the power source for supplying the semiconductor chip varies, adjusts the cooling capacity of the cooling means by outputting the cooling means control signal depending on the outputted power source variation signal, the data processing device only performs as far as outputting the cooling means control signal and cannot detect whether the cooling means is actually adjusted, so that alteration is produced in an operation of the cooling means. Moreover, the technology of JP-A-2003-108241 is one that outputs a signal prior to activation of the thermal shutdown, so that an outside microcomputer can use it by specifying a signal outputted by the temperature detection circuit depending on a detection temperature to be two-stage signals. The temperature detecting circuit provided in the interior of the semiconductor chip only performs as far as outputting two-stage signals, and cannot detect whether actions corresponding to these two-stage signals, especially thermal shutdown that is an action of the second stage, are actually activated.

Therefore, what is a goal of the present invention is to detect whether the electric power of the LSI is reduced actually when the LSI is shifted to the low power mode, and if the electric power is not reduced, a certain signal will be outputted.

One typical example of the present invention is as follows.

That is, the detection system of the present invention has a first operation mode corresponding to a first operation and a second operation mode corresponding to a second operation, and is characterized in that when a first signal for switching the first operation mode and the second operation mode is inputted and if it is detected that the operation is not switched between the first operation and the second operation, it performs a third operation.

Moreover, the semiconductor device of the present invention includes a circuit block for performing a predetermined processing on an inputted signal, and is characterized that the circuit block has a first operating state and a second operating state and have a function of, when the first signal for switching the first operation mode corresponding to the first operating state and the second operation mode corresponding to the second operating state is inputted, detecting that the operating state switched between the first operating state and the second operating state.

Furthermore, the data processing device of the present invention is configured with a semiconductor integrated circuit mounted thereon that has the first operating state and the second operating state, and is characterized that when the first signal for switching an operation mode of the semiconductor integrated circuit between the first operation mode corresponding to the first operating state and the second operation mode corresponding to the second operating state is inputted into the semiconductor integrated circuit and if the operating state does not change in response to a change of the operation mode, a second signal is outputted and the semiconductor integrated circuit shifts to a third operating state based on the second signal.

According to the present invention, it becomes possible to, when the LSI shifted to a low power mode and if the electric power is not successfully reduced for a certain reason, output to the outside that the electric power is not reduced.

DETAILED DESCRIPTION OF THE PREFERRED EMBODIMENTS

Figure 1:
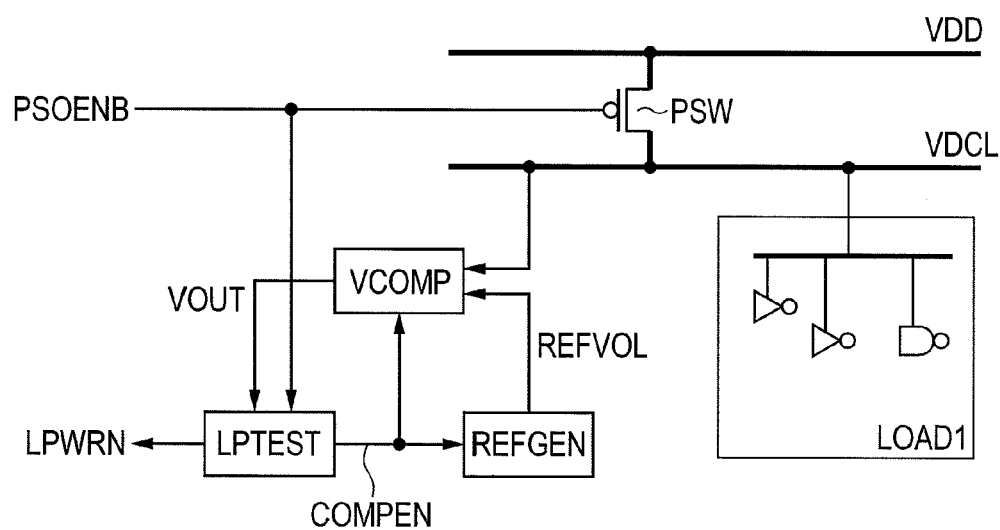
FIG. 1 is a schematic diagram of an internal structure of an LSI to which the present invention was applied.

A typical data processing device of the present invention has a function of measuring the electric power that an LSI consumes, and when the LSI shifts to a low power mode, measures the electric power that the LSI consumes. If the electric power is larger than the electric power of the low power mode that is assumed, it outputs a signal indicating that the electric power is not reduced in the low power mode.

More specifically, the detection system of the present invention has a first operation mode corresponding to a first operation and a second operation mode corresponding to a second operation, and, when a first signal for switching the first operation mode and the second operation mode is inputted and if the system detects that an operation is not switched between the first operation and the second operation, performs a third operation.

As the third operation, for example, an operation of outputting an alarm signal may be chosen, but the present invention is not limited to it.

As the first and second operations, for example, it can be configured that the first operation is an operation that uses a first electric power as a power consumption and the second operation is an operation that uses a second electric power larger than the first electric power as a power consumption, but the present invention is not limited to it.

Moreover, a semiconductor device of the present invention is equipped with a circuit block for performing a predetermine processing on an inputted signal, having a following function. That is, the circuit block has a first operating state and a second operating state, and has a function of, when the first signal for switching the first operation mode corresponding to the first operating state and the second operation mode corresponding to the second operating state is inputted, detecting that an operating state was switched between the first operating state and the second operating state.

The semiconductor device of the present invention will be suitable if it is configured to have a circuit for measuring the power consumptions of the first operating state and the second operating state. The circuit for measuring the power consumption can be specified to be, for example, a circuit for measuring a current of a power source, a circuit for measuring a potential of a power source line, or a circuit for measuring a temperature, but the present invention is not limited to them.

When the circuit for measuring a potential of the power source line is applied as the circuit for measuring the power consumption, the circuit for measuring the potential of the power source line may be specified as: a circuit for comparing an inputted reference potential and the voltage; a circuit for measuring a frequency of an oscillating circuit that is connected to the power source line; or a circuit for measuring the potential of the power source line depending on presence/ absence of oscillation of the oscillating circuit connected to the power source line. However, the present invention is not limited to them.

When the circuit for measuring the temperature is applied as a circuit for measuring the power consumption, it is suitable to configure the circuit so that the electric powers of the first operating state and the second operating state may be measured by a comparison with a predetermined temperature. Alternatively, it is also suitable to configure the circuit so that variations of electric powers of the first operating state and the second operating state may be detected by variations of the temperatures measured by the circuit for measuring the temperature. Furthermore, it is suitable to configure the circuit so that those electric powers of the first operating state and the second operating state may be detected by a comparison between the temperature of the circuit being in the first operating state and the temperature of the circuit being in the second operating state. However, the present invention is not limited to these configurations.

Furthermore, the data processing device of the present invention is constructed with a semiconductor integrated circuit mounted thereon that has the first operating state and the second operating state, and has following characteristics. That is, when the first signal for switching an operation mode of the semiconductor integrated circuit between the first operation mode corresponding to the first operating state and the second operation mode corresponding to the second operating state is inputted into the semiconductor integrated circuit and if the operating state does not change in response to a change of the operation mode, the second signal is outputted and the semiconductor integrated circuit shifts to a third operating state based on the second signal.

If the second signal is made to output from the semiconductor integrated circuit, it will be suitable. In that case, if the second signal is made to output based on the power consumption measured inside the semiconductor integrated circuit, it will be more suitable.

The third operating state can be, for example, an operating state of non-activating the semiconductor integrated circuit, or an operating state of generating a signal that urges replacement of the board on which the semiconductor integrated circuit is mounted, but the present invention is not limited to them.

The data processing device of the present invention will be suitable if it is configured to have a device for measuring the current of the power source that is supplied to the semiconductor integrated circuit and generate the second signal by a change of the current.

Hereafter, each of embodiments of the present invention will be described in detail using drawings.

First Embodiment

FIG. 1 shows a schematic diagram of an internal structure of the LSI that uses the present invention. In FIG. 1, symbols indicate as follows: VDD is the power source line; PSW is a power source switch for interrupting the power source; PSOENB is a control signal for controlling the power source switch; VDCL is a local power source line capable of interrupting a supply of the power source; LOAD1 is an operation circuit to which the local power source VDCL supplies the power source; REFGEN is a reference potential generating circuit; REFVOL is a reference potential signal; VCOMP is a voltage comparator circuit; VOUT is a signal representing a comparison result of the voltage comparator circuit VCOMP; LPTEST is a test circuit for testing a low voltage operation mode; COMPEN is a signal by which the LPTEST controls the VCOMP; and LPWRN is a signal of outputting whether the electric power is reduced at the time of the low voltage operation mode.

In this structure, when the operation circuit LOAD1 is in operation, "L (low)" is inputted Pinto the PSOENB and the power source switch PSW turns on. A potential of the VDCL becomes the same potential as that of the VDD, and the LOAD1 operates normally. In this circuit, when the operation circuit LOAD1 is not in operation, in order to reduce a leakage current of the LOAD1 that is consumed even when being not in operation, the LOAD1 is made to shift to the low power mode that interrupts the power source. When this circuit shifted to the low power mode, the PSOENB becomes "H (high)" and the power source switch PSW turns off. By this, the potential of the VDCL falls and the leakage current flowing through the LOAD1 can be reduced.

In this low power mode, if the VDCL potential does not fall due to a certain cause, the potential of the LOAD1 does not fall, the leakage current continues flowing, and the electric power in the LOAD1 cannot be reduced. Therefore, it is necessary to take a certain measure, such as halting this LSI, in the apparatus mounted with this LSI.

In the circuit of FIG. 1, it becomes possible to judge whether the VDCL potential has fallen in the low power mode. In this circuit, upon output of a signal COMPEN for starting a test from the circuit LPTEST that tests a malfunction of the low power mode, the REFGEN generates the reference potential REFVOL having a higher potential than the VDCL potential that is assumed when shifting to the low power mode, and simultaneously the voltage comparator circuit VCOMP compares the reference potential REFVOL and the potential of the VDCL and outputs its result as the VOUT. The LPTEST determines whether the LSI is in the low power mode and which is higher, the reference potential REFVOL or the VDCL potential. When the LSI is in the low power mode and the VDCL potential is higher than the reference potential, the LPTEST judges that there is the malfunction in the low power mode, and outputs the LPWRN.

Figure 2:
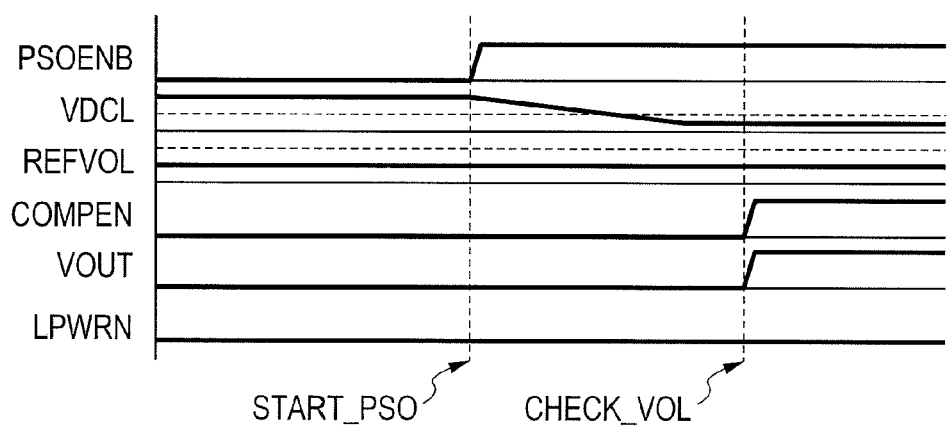
FIG. 2 is an operation waveform of the LSI to which the present invention was applied.

FIG. 2 shows waveforms of respective parts of the circuit when there is no malfunction in the low power mode. At time START PSO, the PSOENB that is a signal instructing power source interruption changes from "H" to "L." When the low power mode is operating normally, the power source switch is interrupted and the potential of the local power source VDCL falls from a VDD potential. At time CHECK_VOL after a lapse of the fixed time after the power source interruption started, upon output of the COMPEN from the circuit LPTEST for verifying an operation of the low power mode, the potential of the VDCL and the reference potential REFVOL are compared. Since the potential of the VDCL is lower, the output VOUT of the voltage comparator circuit VCOMP becomes "H." Therefore, in the low power mode, since the value of the VOUT has become "H," and thereby it can be checked that the low power mode is operating normally, the output signal LPWRN of the LPTEST remains "L" as it was before.

Figure 3:
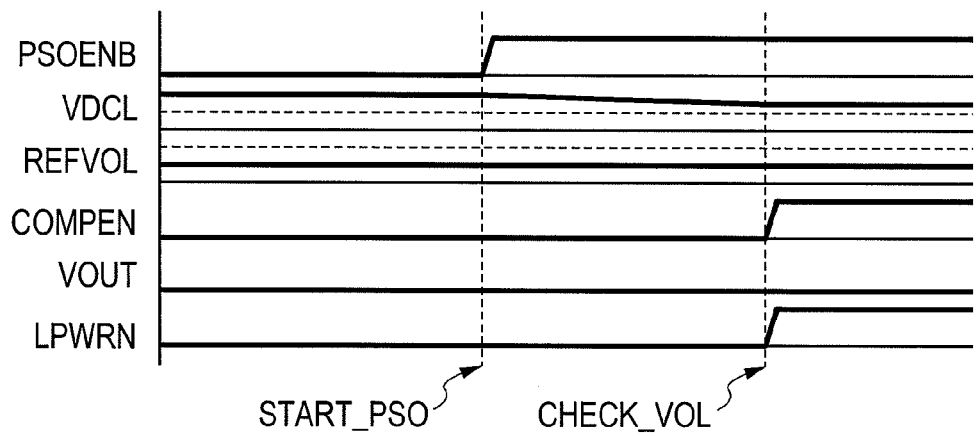
FIG. 3 is an operational waveform of the LSI to which the present invention was applied.

FIG. 3 shows operation waveforms of respective parts of the circuit when there is the malfunction in the low power mode. At time START PSO, the PSOENB that is a signal instructing the power source interruption changes from "H" to "L." If the low power mode is not operating normally, even after the PSOENB was inputted, the potential of the local power source VDCL will not fall lower than a fixed value. At time CHECK_VOL after a lapse of the fixed time after the power source interruption started, upon output of the COMPEN from the circuit LPTEST for verifying an operation of the low power mode, the potential of the VDCL and the reference potential REFVOL are compared, and since the potential of the VDCL is higher, the output VOUT of the voltage comparator circuit VCOMP becomes "L." Therefore, in the low power mode, since the value of the VOUT is "L" and thereby it can be checked that there is abnormality in the low power mode, the output signal LPWRN of the LPTEST becomes "H," which is outputting that there is the abnormality in the low power mode.

Figure 4:
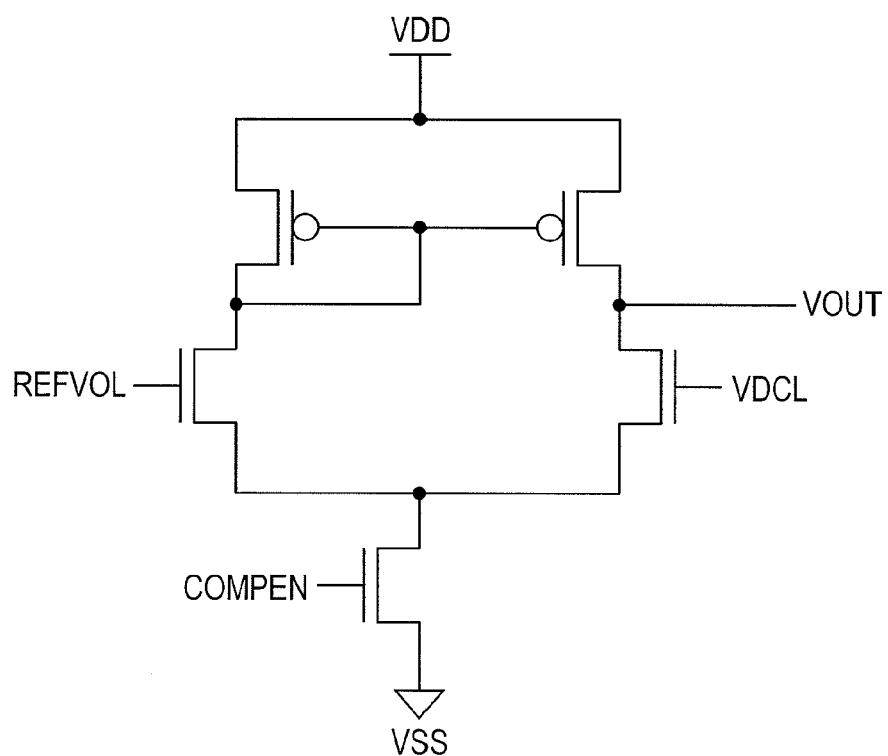
FIG. 4 is a circuit diagram of a voltage comparator circuit.

FIG. 4 shows one example of a circuit configuration of the voltage comparator circuit VCOMP. This circuit is comprised of a current mirror, and when the COMPEN becomes "H," operates and compares the REFVOL and the potential of the VDCL. When the VDCL potential is lower, "H" is outputted from a terminal of the VOUT; when the VDCL potential is higher, "L" is outputted from the terminal of the VOUT.

Figure 5:
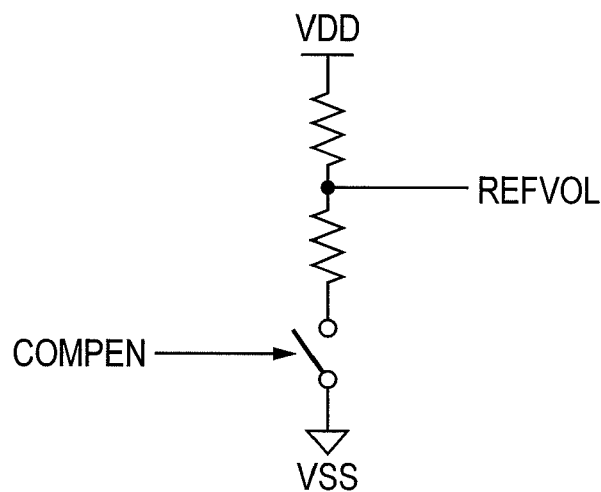
FIG. 5 is a circuit diagram of a reference potential generating circuit.

FIG. 5 shows one example of a circuit configuration of the reference potential generating circuit REFGEN. In this circuit, resistances are connected in series and a potential of a portion to which the resistance is connected is outputted as the reference potential REFVOL. It becomes possible to easily form the resistance by an ON resistance or OFF resistance of a transistor, or a polysilicon resistance, or a metallic wiring resistance, or a resistance that uses a well or diffusion. Furthermore, in this circuit, a switch is connected to the resistance in series; the switch is controlled by the COMPEN and, only when voltage comparison is performed, turns on.

Figure 6:
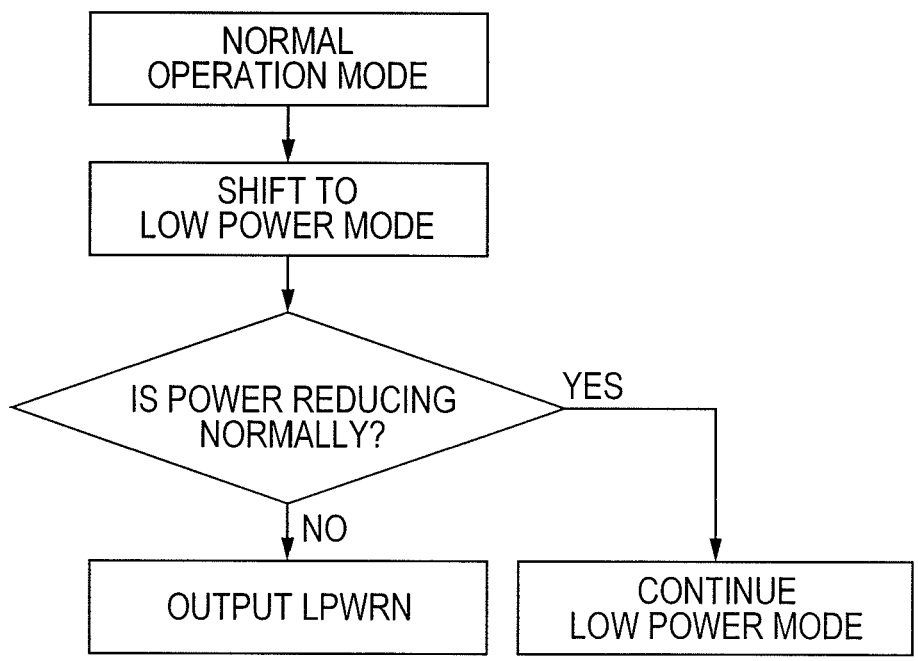
FIG. 6 is a diagram showing an operation sequence of the LSI to which the present invention was applied.

FIG. 6 shows a sequence of determining whether the low power mode of the LSI is normal using the present invention. In a normal operation mode, the circuit is performing a normal operation. After having shifted to the low power mode by the control signal, determination as to whether the electric power is successfully reduced is performed. If the electric power is successfully reduced normally, the circuit continues the low power mode as it was before. If the electric power is not successfully reduced, the circuit outputs the signal LPWRN indicating an alarm that the electric power is not successfully reduced in the low power mode.

Figure 7:
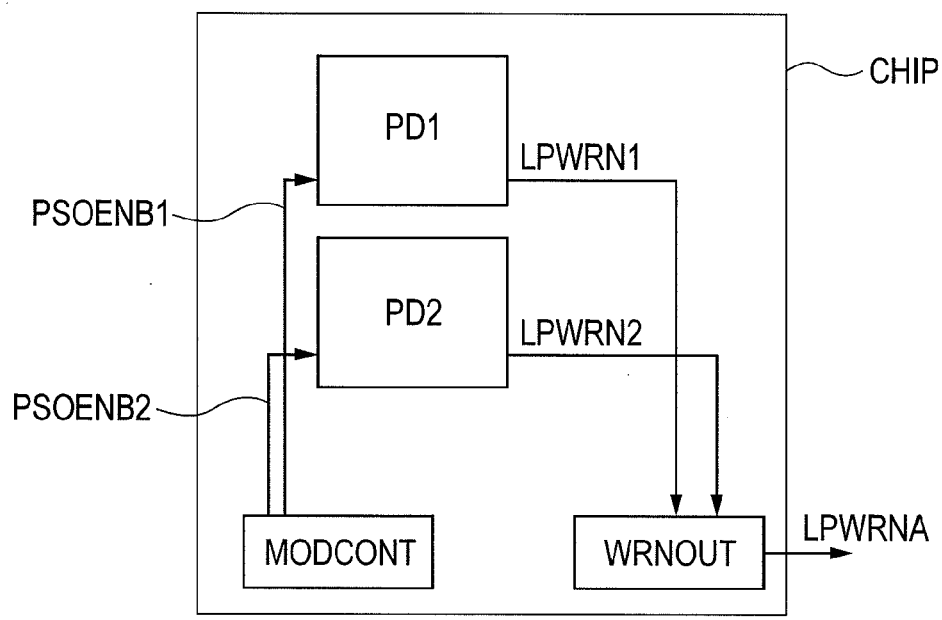
FIG. 7 is a circuit block schematic diagram of an LSI to which the present invention was applied.

FIG. 7 shows a schematic diagram of a circuit block of the LSI that uses the present invention. In FIG. 7, symbols indicate as follow: CHIP is an LSI chip; PD1 and PD2 are power domains each of which is a circuit block to which the low power mode is applied, respectively; PSOENB1 and PSOENB2 are signals that control the power modes of the power domains PD1 and PD2; respectively; MODCONT is a control circuit for controlling the power mode; LPWRN1 and LPWRN2 are alarm signals when the low power modes of the power domains PD1 and PD2 are defective, respectively; WRNOUT is a circuit for outputting an alarm to outside the LSI chip when there is the malfunction in the low power modes of the PD1 or PD2; and LPWRNA is an alarm signal indicating that there is a low power mode malfunction in this LSI chip.

FIG. 7 shows an example to which the present invention is applied when there are plural power domains each of which becomes the low power mode inside the LSI. The operation mode of each power domain is controlled by the MODCONT and, for example, when letting the power domain PD1 go into the low power mode, the PSOENB1 is inputted. The inside of the PD1 has the same configuration as FIG. 1. It tests whether the low power mode is operating normally and, if there is the malfunction in the low power mode, outputs the LPWRN1. The WRNOUT is monitoring whether operations of the low power modes of the plural power domains are performing normally or abnormally, and, for example, when the alarm signal is outputted from the LPWRN1, outputs a signal indicating that there is a low power mode malfunction in this chip to outside the chip as the LPWRNA.

Figure 8:
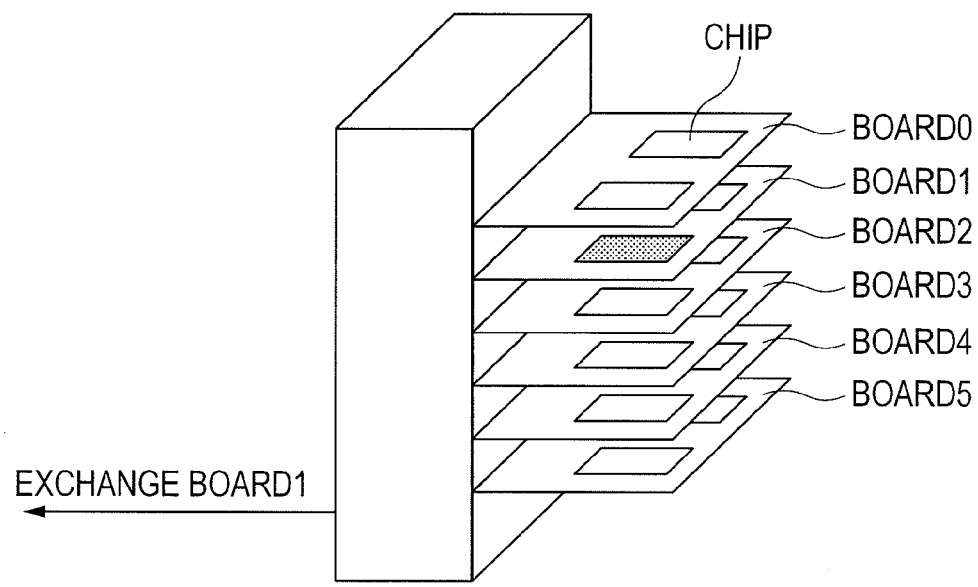
FIG. 8 is a schematic diagram of an information apparatus.

FIG. 8 schematically shows an example of an information apparatus that carries six boards each mounted with chips of FIG. 7. This device carries boards BOARD0 to BOARD5 each mounted with two chips of FIG. 7. For example, in case the low power mode malfunction occurs inside the LSI chip mounted on the BOARD1, the LSI chip outputs a signal indicating that there is the low power mode malfunction inside the chip as in FIG. 7. In response to this signal, within the board, information that a chip having the malfunction in the low power mode is mounted inside the BOARD1 is transmitted within the apparatus, and an action that urges replacement of the BOARD1 out of this apparatus is taken (Exchange BOARD1). Thereby, in the apparatus mounted with the LSI to which the present invention is applied, it becomes possible to prevent occurrence of a malfunction due to insufficiency of power source performance and heating of the apparatus due to insufficiency of cooling capacity.

In this embodiment, normality/abnormality of an operation of the low power mode, namely the power source interruption, is judged by measuring the potential of the power source that is interrupted. Therefore, in this embodiment, it becomes possible to detect failures of various power source interruptions such as short circuit of the power source VDD and the local power source VDCL, short circuit of the power source switch for interrupting the power source, and a defect of power source interruption control signal. Moreover, since a variation of the potential of the power source is detected in this embodiment, it is possible to use the present invention not only for the low power mode using the power source interruption but also for determination of operations, such as the low power mode of reducing the electric power by lowering the power source voltage.

As described above, the use of the present invention makes it possible to output an alarm in the case where the LSI having the low power mode shifted to the low power mode yet fails in reducing the electric power and to avoid performance deterioration and damage of the apparatus.

Second Embodiment

Figure 9:
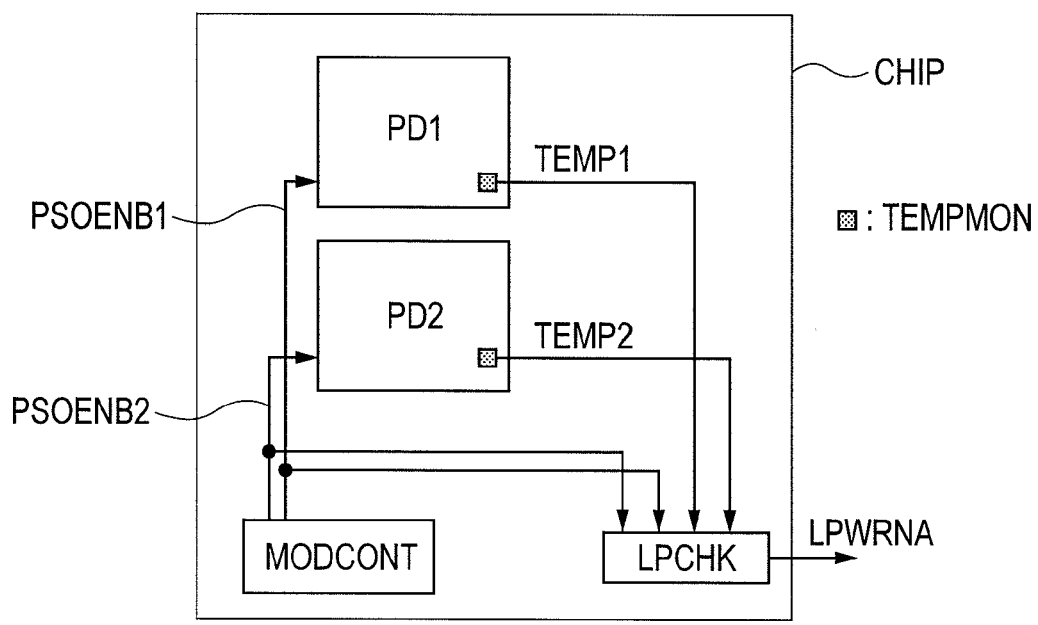
FIG. 9 is a circuit block schematic diagram of the LSI to which the present invention was applied.

FIG. 9 shows a schematic diagram of a circuit block of the LSI that uses the present invention. In FIG. 9, symbols indicate as follow: CHIP is the LSI chip; PD1 and PD2 are the power domains each of which is a circuit block to which the low power mode is applied, respectively; PSOENB1 and PSOENB2 are the signals that control the power modes of the power domains PD1 and PD2; respectively; MODCONT is the control circuit for controlling the power mode; WRNOUT is the circuit for outputting an alarm to outside the LSI chip if there is the malfunction in the low power mode of the PD1 or PD2; and LPWRNA is the alarm signal indicating that there is the low power mode malfunction in this LSI chip. TEMP1 and TEMP2 are signals indicating temperature information in the power domains PD1 and PD2, respectively. LPCHK is a circuit that judges whether there is the malfunction in the low power mode from information of the TEMP1 and the TEMP2, and if there is the malfunction, outputs the alarm signal LPWRNA. TEMPMON is a thermometer for measuring a temperature inside the LSI.

Figure 10:
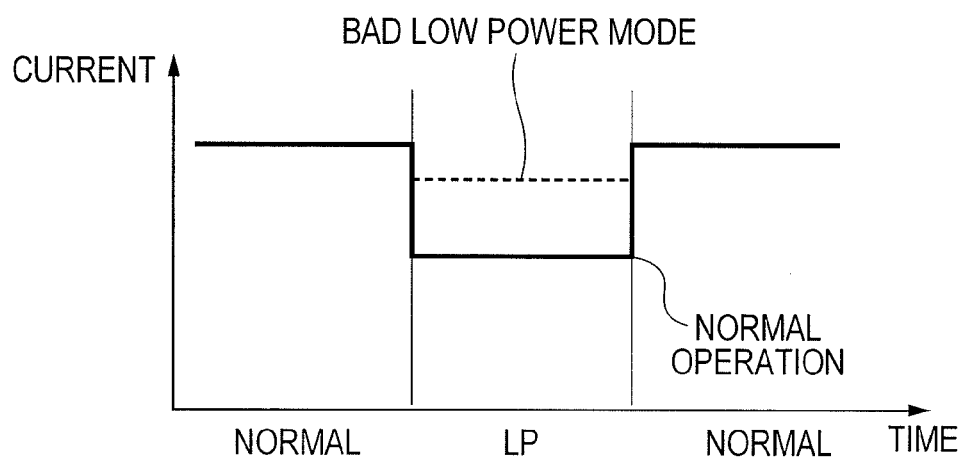
FIG. 10 is a current change schematic diagram.
Figure 11:
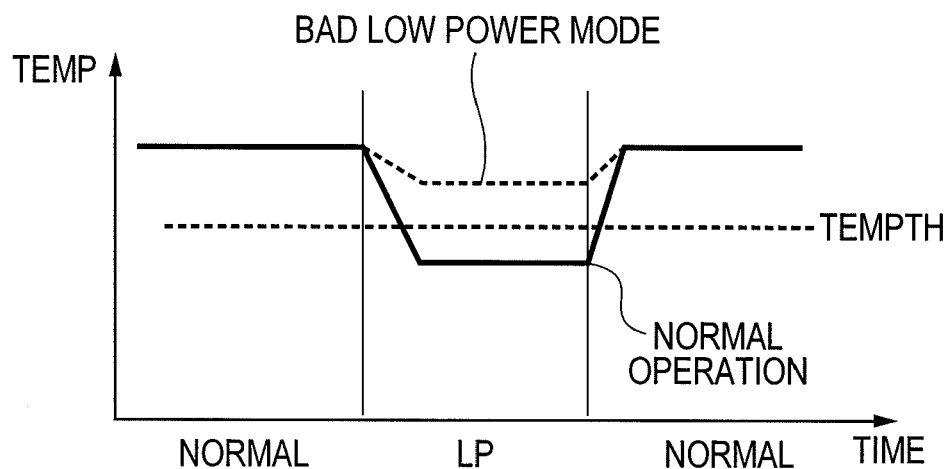
FIG. 11 is a temperature change schematic diagram.

Inside the LSI, if the low power mode is operating normally, the current decreases; contrary to this, if there is the malfunction in the low power mode, the width of decrease of the current when having shifted to the low power mode is small. FIG. 10 shows this situation. In FIG. 10, "Normal" indicates the normal operation and "LP" indicates a low power operating state. When this current relationship exists, the temperature inside the LSI varies according to the flowing current. FIG. 11 shows a temperature relationship in this case. If the electric power is reduced normally in the low power mode, the temperature falls as compared with the case where the normal operation is being performed. Contrary to this, if there is the malfunction in the low power mode and the current does not decrease, a fall width of the temperature inside the LSI is also small. Thus, measurement of a temperature inside the chip enables to measure a flowing current in a pseudo manner. Therefore, when the signal of the PSOENB1 is inputted into the LSI of FIG. 9, the temperature inside the PD1 is measured and the temperature is put into comparison to check whether the temperature there is reduced by a fixed amount or more. For example, when the temperature is lower than the TEMPTH in FIG. 11, it can be judged that the low power mode is operating normally; conversely, when it is higher than the TEMPTH, it can be judged that the low power mode is not operating normally, and the alarm signal LPWRNA of FIG. 9 is outputted.

In this embodiment, since the current inside the LSI can be measured in a pseudo manner by measuring the temperature inside the LSI, it becomes possible to detect malfunctions of various low power modes, such as the power source interruption, the low voltage operation mode, and clock gating.

As described above, the use of the present invention makes it possible to output an alarm in the case where the LSI having the low power mode shifted to the low power mode yet fails in reducing the electric power and to avoid performance deterioration and damage of the apparatus.

Third Embodiment

Figure 12:
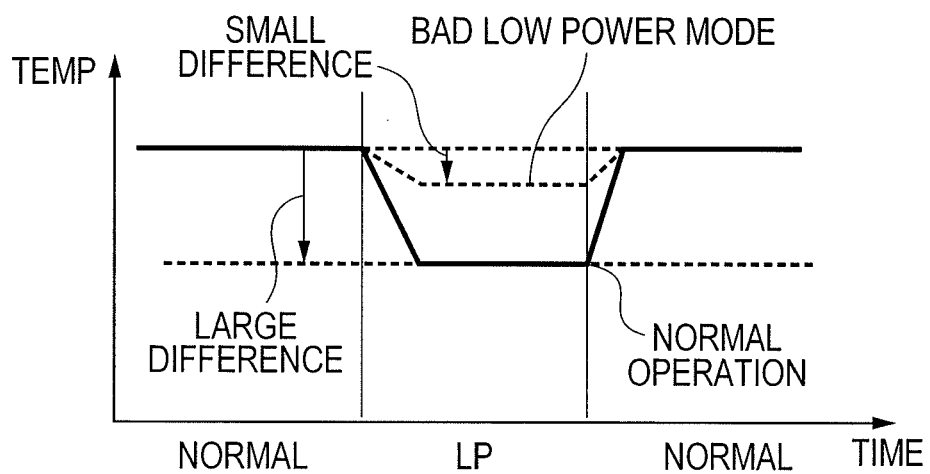
FIG. 12 is a temperature change schematic diagram.

FIG. 12 shows a temperature measurement waveform in the case of detecting the malfunction of the low power mode by a control different from that of the second embodiment using the circuit of FIG. 9. In FIG. 12, "Normal" indicates the normal operation and "LP" indicates the low power mode. In FIG. 12, if there is no malfunction in the low power mode, at the time of shifting from the normal operation to the low power mode, the temperature changes largely. Contrary to this, if there is the malfunction in the low power mode, a temperature change at the time of shifting from the normal operation to the low power mode is small.

Therefore, in the LSI of FIG. 9, in the case of before and after inputting of the signal of the PSOENB1, measurement of the temperatures inside the PD1 enables to determine whether the low power mode is operating normally, and if there is the malfunction in the low power mode, the alarm signal LPWRNA of FIG. 9 is outputted.

In this embodiment, since the current inside the LSI can be measured in a pseudo manner by measuring the temperature inside the LSI, it becomes possible to detect malfunctions of various low power modes, such as the power source interruption, the low voltage operation mode, and the clock gating.

As described above, the use of the present invention makes it possible to output an alarm in the case where the LSI having the low power mode shifted to the low power mode yet fails in reducing the electric power and to avoid performance deterioration and damage of the apparatus.

Fourth Embodiment

Figure 13:
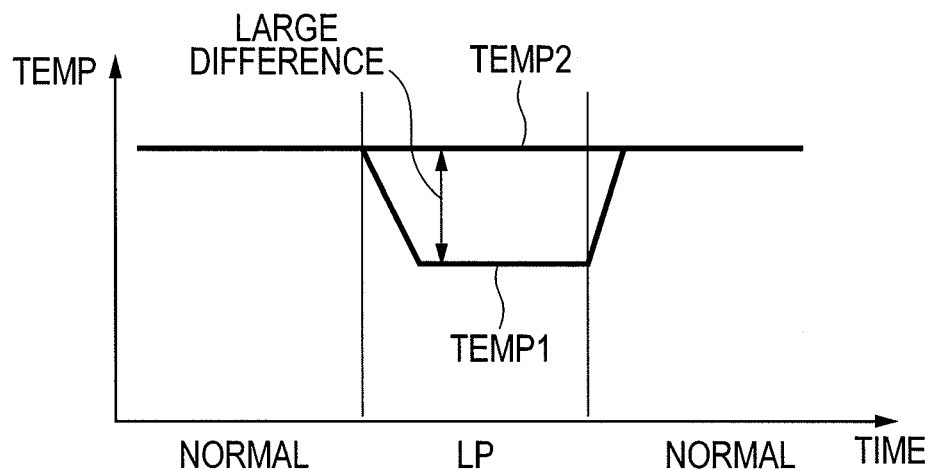
FIG. 13 is a temperature change schematic diagram.
Figure 14:
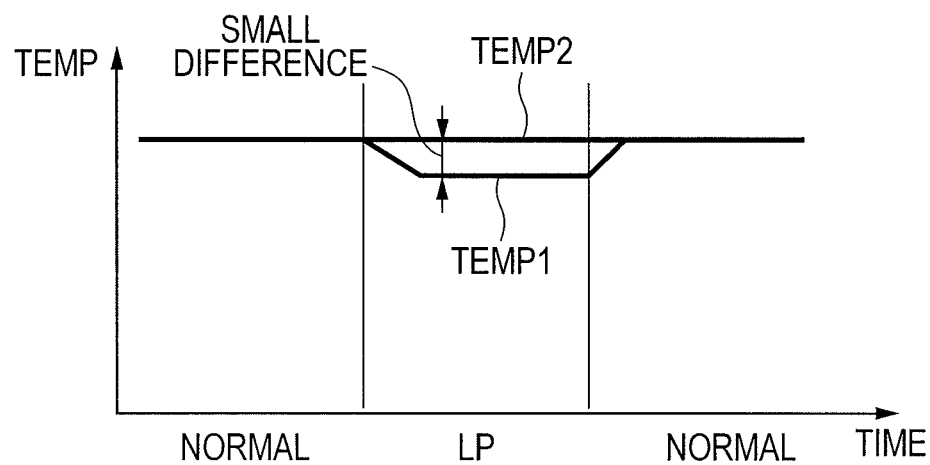
FIG. 14 is a temperature change schematic diagram.

FIG. 13 and FIG. 14 show temperature measurement waveforms in the case of detecting the malfunction of the low power mode by a control different from that of the second embodiment using the circuit of FIG. 9. The TEMP1 and the TEMP2 show temperatures of PSO1 and PS02, respectively. This diagram shows a case where the PSO2 is always performing the normal operation, and the PSO1 performs the normal operation in the period of Normal and shifts to the low power mode in the period of LP. FIG. 13 shows a temperature state when there is no malfunction in the low power mode. In this case, when only the PSO1 shifted to the low power mode, a difference in temperature between the PSO1 and the PSO2 is large. FIG. 14 shows a temperature state where there is the malfunction in the low power mode. In this case, even when only the PSO1 shifted to the low power mode, the difference in temperature between the PSO1 and the PSO2 is small.

Therefore, in the LSI of FIG. 9, comparison of the temperatures of the PD1 and the PD2 after the signal of the PSOENB1 was inputted makes it possible to determine whether the low power mode is operating normally, and if there is the malfunction in the low power mode, the alarm signal LPWRNA of FIG. 9 will be outputted.

In this embodiment, since the current inside the LSI can be measured in a pseudo manner by measuring the temperature inside the LSI, it becomes possible to detect a malfunction of various low power modes, such as the power source interruption, the low voltage operation mode, and the clock gating.

As described above, the use of the present invention makes it possible to output an alarm in the case where the LSI having the low power mode shifted to the low power mode yet fails in reducing the electric power and to avoid performance deterioration and damage of the apparatus.

Fifth Embodiment

Figure 15:
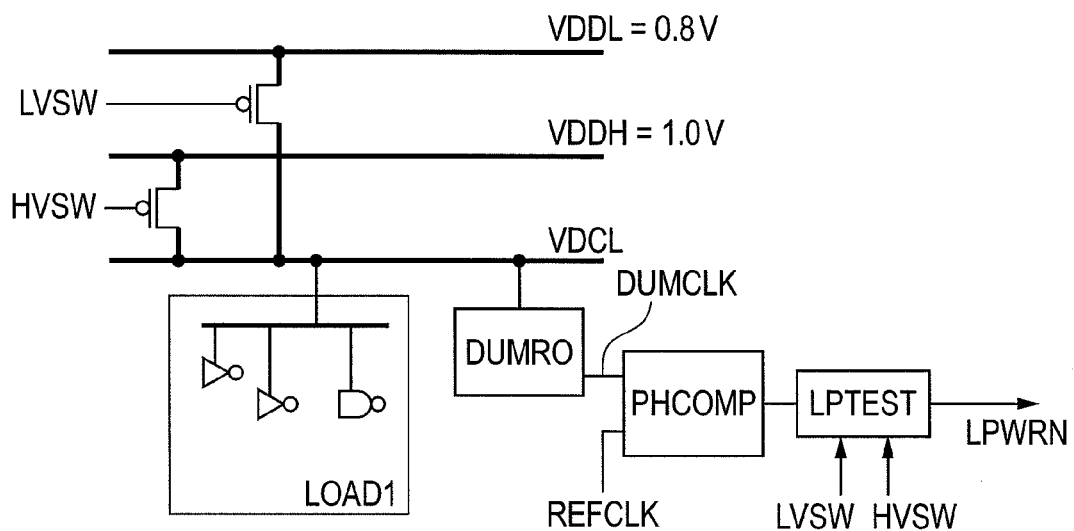
FIG. 15 is a schematic diagram of an internal structure of the LSI to which the present invention was applied.

FIG. 15 shows a schematic diagram of an internal structure of the LSI that uses the present invention. In FIG. 15, symbols indicate as follows: VDDL is a power source line of 0.8 V; VDDH is a power source line of 1.0 V; LVSW is a signal line for controlling a switch of a low voltage power source; HVSW is a signal line for controlling a switch of a high voltage power source; VDCL is a local power source line capable of switching a power source voltage; LOAD1 is an operation circuit to which a power source is supplied by the local power source VDCL; LPTEST is a test circuit for testing the low voltage operation mode; DUMRO is a ring oscillator module; DUMCLK is an output signal of the DUMRO; REFCLK is a reference clock; PHCOMP is a frequency comparator circuit; and LPWRN is a signal of outputting whether the electric power is reduced at the time of the low voltage operation mode.

In this structure, when operating the operation circuit LOAD1 at high speed, a high voltage is impressed to the LOAD1 by connecting the local power source VDCL to the power source VDDH of a high voltage (1.0 V) with the HVSW set to "L" and the LVSW set to "H." Moreover, when the LOAD1 does not need a high operation speed, a low voltage is impressed to the LOAD1 by connecting the local power source VDCL to the power source VDDL of a low voltage (0.8 V) with the HVSW set to "H" and the LVSW set to "L," and therefore it becomes possible to reduce the electric power although the operation speed of the LOAD1 becomes slow.

In this circuit, when being in the low power mode, namely when the potential of the local power source is set to 0.8 V, if the VDCL potential does not fall from 1.0 V due to a certain cause, the potential of the LOAD1 will not fall and the power consumption of the LOAD1 cannot be reduced. Therefore, it is necessary to take a certain measure of halting this LSI or the like in an apparatus mounted with this LSI.

In the circuit of FIG. 1, it becomes possible to judge whether the VDCL potential has fallen in the low power mode. In this circuit, in the circuit LPTEST for testing the malfunction of the low power mode, when having shifted to the low power mode due to the signals LVSW and HVSW each for controlling the power source switch, an output of the DUMRO that is a dummy ring oscillator and a frequency of the reference clock REFCLK are compared and its output is inputted into the LPTEST. Since the dummy ring oscillator is supplied the power source from the local power source VDCL, the frequency outputted from it fluctuates depending on the potential of the VDCL. Therefore, when the potential of the local power source VDCL has not fallen lower than a certain fixed voltage, the ring oscillator operates at a speed faster than a setup frequency. If the frequency of the reference clock is set to a somewhat higher frequency than a frequency at which the dummy ring oscillator operates with a low power source voltage, it will become possible to judge whether the VDCL potential has fallen to 0.8 V, namely whether the low power mode is operating normally.

Figure 16:
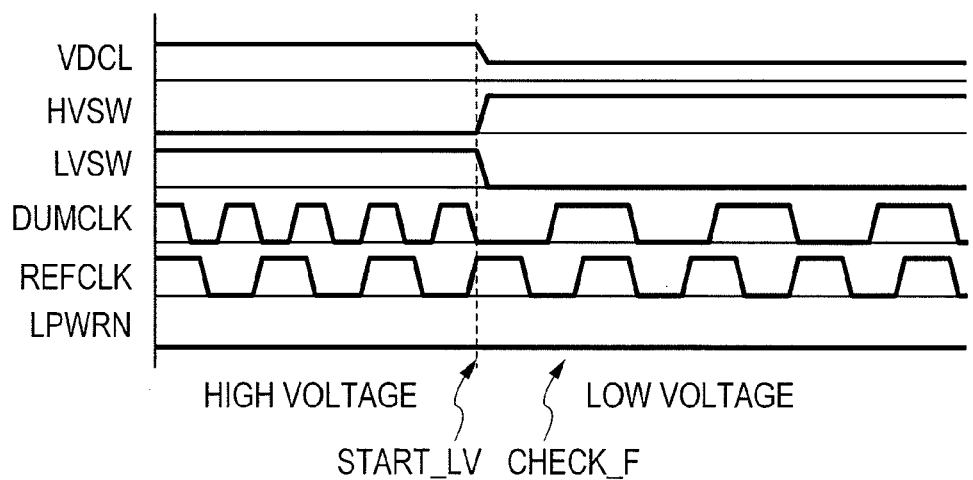
FIG. 16 is a, diagram showing an operation waveform of the LSI to which the present invention was applied.

FIG. 16 shows operation waveforms of respective parts of the circuit when there is no malfunction in the low power mode. At time START_LV, in order to set the local power source potential to a low voltage, the HVSW changes from "L" to "H," and the LVSW changes from "H" to "L." When the low power mode is operating normally, the potential of the local power source VDCL falls to 0.8 V. At time CHECK_F after a lapse of a fixed time after the power source voltage changed, comparison between the output of the DUMRO and the frequency of the reference clock REFCLK enables to check that the low power mode is operating normally because a frequency of the DUMCLK is low, and the output signal LPWRN of the LPTEST remains "L" as it was before.

Figure 17:
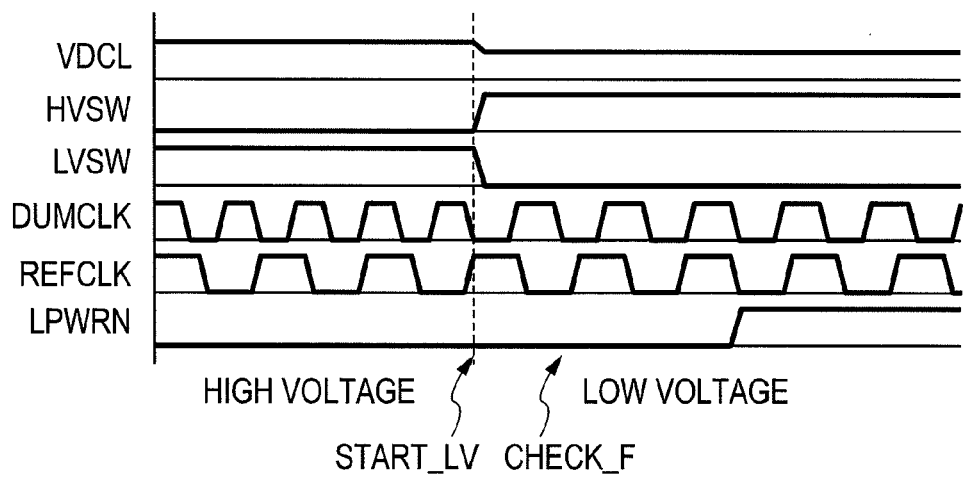
FIG. 17 is a diagram showing an operation waveform of the LSI to which the present invention was applied.

FIG. 17 shows operation waveforms of respective parts of the circuit when there is the malfunction in the low power mode. At time START_LV, in order to set the local power source potential to a low voltage, the HVSW changes from "L" to "H," and the LVSW changes from "H" to "L." Since the low power mode is not operating normally, the potential of the local power source VDCL does not fall to 0.8 V. At time CHECK_F after a lapse of a fixed time after the power source voltage changed, comparison of the output of the DUMRO and a frequency of the REFCLK shows that the frequency of the DUMCLK is higher, which reveals that there is the malfunction in the low power mode, and the output signal LPWRN of the LPTEST becomes "H."

Although the frequency comparator circuit is not shown here, it can be easily formed with a circuit for counting the number of times of rise of the clock inputted in a fixed time.

Moreover, in this circuit configuration, the low power mode of interrupting the power source can be performed by interrupting switches that connect the local power source and the power sources VDDL and VDDH.

Figure 18:
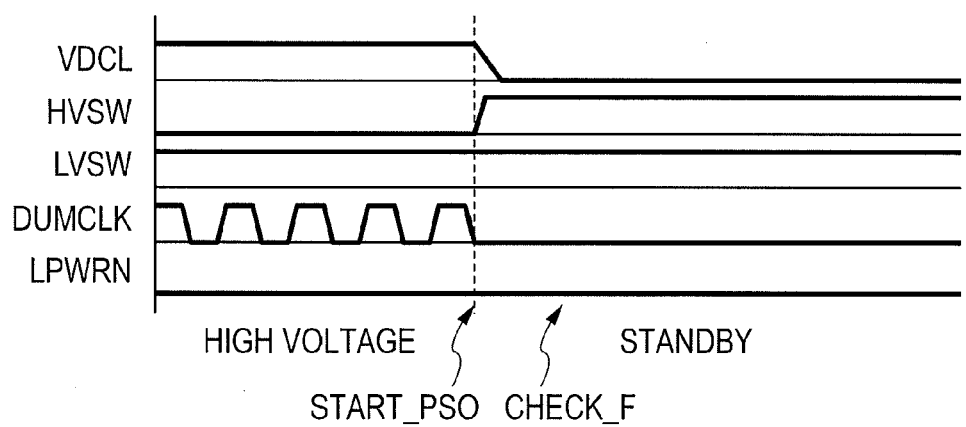
FIG. 18 is a diagram showing an operation waveform of the LSI to which the present invention was applied.

FIG. 18 shows operation waveforms of respective parts of the circuit when there is no malfunction in the power source interruption. At time START_PSO, in order to interrupt the power source of the local power source potential, the HVSW changes from "L" to "H", and the LVSW maintains "H." When the power source interruption is operating normally, the potential of the local power source VDCL falls to near 0 V, and checking of the output of the DUMRO at time CHECK_F after a lapse of a fixed time after the power source interruption started shows that the DUMCLK performs no clock operation and thereby it can be checked that the low power mode is operating normally, and the output signal LPWRN of the LPTEST remains "L" as it was before.

Figure 19:
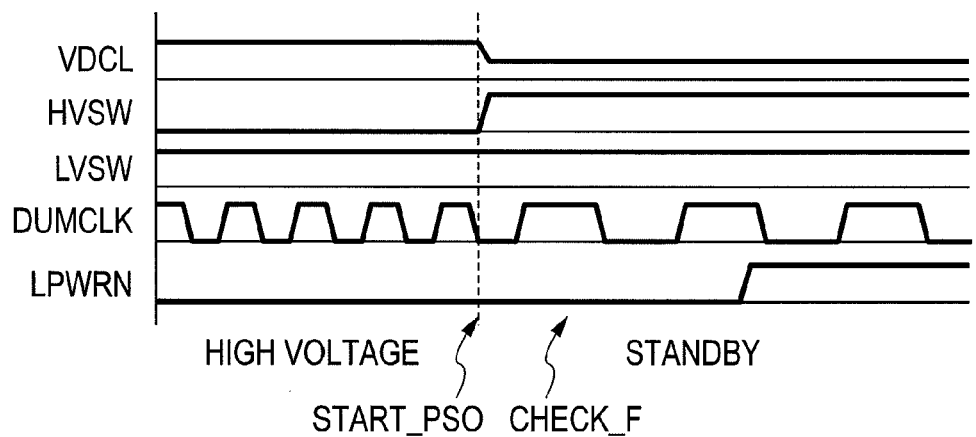
FIG. 19 is a diagram showing an operation waveform of the LSI to which the present invention was applied.

FIG. 19 shows operation waveforms of respective parts of the circuit when there is the malfunction in the power source interruption. At time START_PSO, in order to interrupt the power source of the local power source potential, the HVSW changes from "L" to "H," and the LVSW maintains "H." If there is a defect in a power source interrupting circuit, the potential of the local power source VDCL does not fall, and at time CHECK_F after a lapse of a fixed time after interruption of the power source started, checking of the output of the DUMRO reveals that the DUMCLK is performing a clock operation. In this case, the low power mode does not operate normally and the output signal LPWRN of the LPTEST becomes "H."

In this embodiment, normality/abnormality of an operation of the low power mode, namely the low voltage operation or the power source interception, is judged by measuring the potential of the local power source by a measurement of a frequency of the dummy ring oscillator. Therefore, in this embodiment, it becomes possible to detect failures of various power source interruptions such as short circuit of the power source VDD and the local power source VDCL, short circuit of the power source switch for interrupting the power source, and a malfunction of the power source interruption control signal.

As described above, the use of the present invention makes it possible to output an alarm in the case where the LSI having the low power mode shifted to the low power mode yet fails in reducing the electric power and thereby to avoid performance deterioration and damage of the apparatus.

Sixth Embodiment

Figure 20:
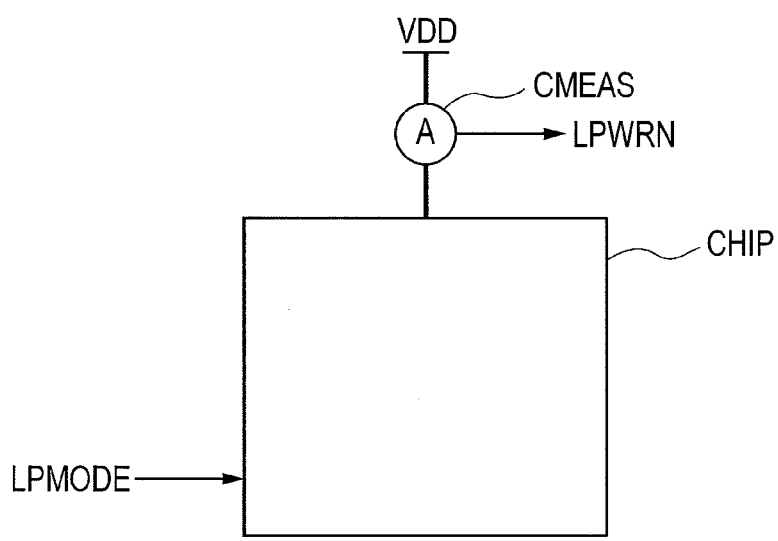
FIG. 20 is a schematic diagram of the internal structure of the LSI to which the present invention was applied.

FIG. 20 shows the LSI that uses the present invention and a circumferential structure thereof. In FIG. 20, symbols indicate as follow: CHIP is the LSI chip; CMEAS is an ammeter; LPMODE is a signal that shifts the mode to the low power mode;

and LPWRNA is a signal indicating the low power mode malfunction.

In this circuit, when the LSI shifted to the low power mode, if there is the malfunction in the low power mode due to a certain cause, the electric power consumed by the CHIP cannot be reduced.

Figure 21:
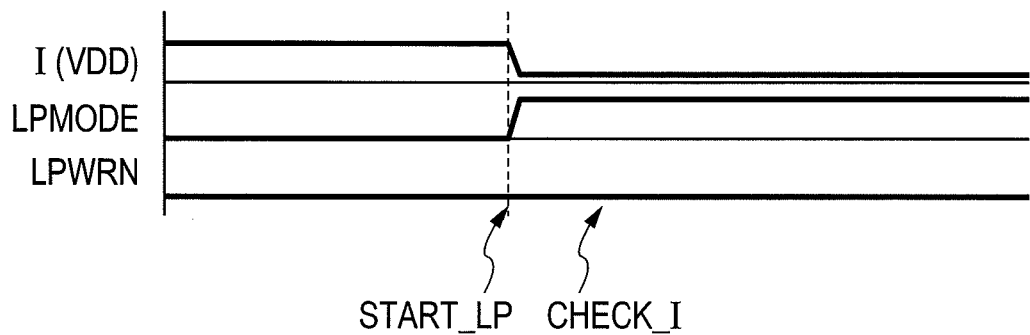
FIG. 21 is a diagram showing an operation waveform of the LSI to which the present invention was applied.

FIG. 21 shows waveforms of respective parts of the circuit when there is no malfunction in the low power mode. At time START_LV, in order to make the CHIP shift to the low power mode, the LPMODE changes from "L" to "H." When the low power mode is operating normally, the current I(VDD) of the power source falls, and at time CHECK_I after a lapse of the fixed time after the power source voltage changed, measurement of the current enables to check that the low power mode is operating normally, and the LPWRN remains "L" as it was before.

Figure 22:
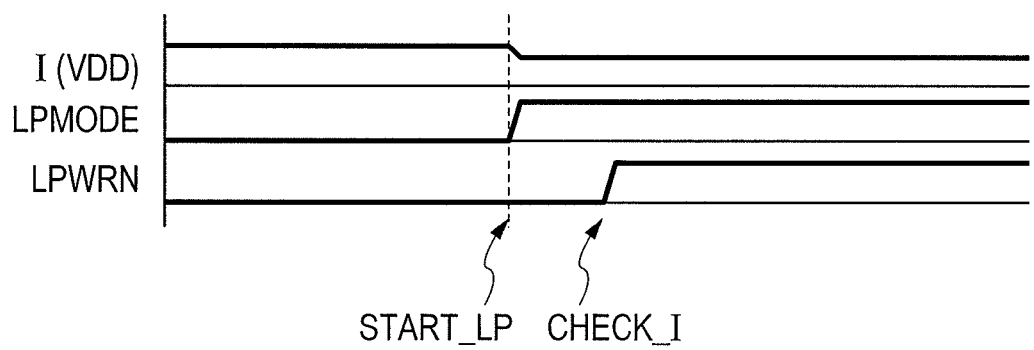
FIG. 22 is a diagram showing an operation waveform of the LSI to which the present invention was applied.

FIG. 22 shows an operation waveform of respective parts of the circuit when there is the malfunction in the low power mode. At time START_LV, in order to make the CHIP shift to the low power mode, the LPMODE changes from "L" to "H." If there is the malfunction in the low power mode, the current I(VDD) of the power source does not fall, and at time CHECK_I after a lapse of the fixed time after the power source voltage changed, measurement of the current checks that there is the malfunction in the low power mode, and the LPWRN remains "H" as it was before.

In this embodiment, normality/abnormality of the low power mode that is the low voltage operation or the power source interruption is judged by directly measuring a current consumed by the LSI. Therefore, in this embodiment, it ,becomes possible to detect failures of various low power modes.

As described above, the use of the present invention makes it possible to output an alarm in the case where the LSI having the low power mode shifted to the low power mode yet fails in reducing the electric power and to avoid performance deterioration and damage of the apparatus.

Moreover, the use of the present invention makes it possible to take a measure of halting the device and the like in the data processing device in case the electric power is consumed more than a design value.

According to each of the above-mentioned embodiments of the present invention, it becomes possible to, when the LSI shifted to the low power mode and if the electric power is not successfully reduced, output that the electric power fails to be reduced to the outside. Furthermore, by outputting the signal to the outside, it becomes possible to prevent the insufficiency of electric power supply of the apparatus mounted with the LSI. Furthermore, by outputting the signal to the outside, it becomes possible to prevent deterioration of the performance of the LSI and deterioration of the performance of the apparatus mounted with the LSI.

What is claimed is:

1. A detection system comprising a circuit block that has a first operation mode corresponding to a normal operation of a large scale integrated circuit (LSI) and a second operation mode corresponding to a low power operation of the LSI, wherein, when an input signal for switching the first operation mode and the second operation mode is inputted, if the circuit block detects that the LSI does not switch from normal operation to low power operation, an output signal is outputted.

2. The detection system according to claim 1, wherein the output signal is an alarm signal.

3. The detection system according to claim 1, wherein the normal operation is an operation that uses a first electric power as a power consumption, and the low power operation is an operation that uses a second electric power smaller than the first electric power as a power consumption.

4. A semiconductor device comprising a circuit block for performing a predetermined processing on an inputted signal, the circuit block having a normal operating state and a low power operating state, wherein the semiconductor device has a function of, when an input signal that switches a first operation mode corresponding to the normal operating state and a second operation mode corresponding to the low power operating state is inputted, detecting that the operating state is switched from the normal operating state to the low power operating state.

5. The semiconductor device according to claim 4, further comprising:
a circuit for measuring the power consumption of the normal operating state and the low power operating state.

6. The semiconductor device according to claim 5, wherein the circuit for measuring the power consumption is a circuit for measuring a current of a power source.

7. The semiconductor device according to claim 5, wherein the circuit for measuring the power consumption is a circuit for measuring a potential of a power source line.

8. The semiconductor device according to claim 7, wherein the circuit for measuring the potential of the power source line is a circuit for comparing the inputted reference potential and the voltage.

9. The semiconductor device according to claim 7, wherein the circuit for measuring the potential of the power source line is a circuit for measuring a frequency of an oscillating circuit connected to the power source line.

10. The semiconductor device according to claim 7, wherein the circuit for measuring the potential of the power source line is a circuit for measuring the potential of the power source line by presence/absence of oscillation of an oscillating circuit connected to the power source line.

11. The semiconductor device according to claim 5, wherein the circuit for measuring the power consumption is a circuit for measuring a temperature.

12. The semiconductor device according to claim 11, wherein electric powers of the normal operating state and the low power operating state are measured by a comparison with a predetermined temperature.

13. The semiconductor device according to claim 11, wherein a variation of the electric power of the normal operating state and the low power operating state is detected by a change of the temperature measured by the circuit for measuring the temperature.

14. The semiconductor device according to claim 11, wherein the electric powers of the normal operating state and the low power operating state are detected by a comparison between the temperature of the circuit being in the normal operating state and the temperature of the circuit being in the low power operating state.

15. A data processing device comprising a semiconductor integrated circuit having a normal operating state and a low power operating state, wherein an input signal for switching an operation mode of the semiconductor integrated circuit between a first operation mode corresponding to the normal operating state and a second operation mode corresponding to the low power operating state is inputted to the semiconductor integrated circuit, and if the operating state does not change in response to a change of the operation mode, an output signal is outputted, and the data processing device is made to shift to a further operating state based on the output signal.

16. The data processing device according to claim 15, wherein the output signal is outputted from the semiconductor integrated circuit.

17. The data processing device according to claim 16, wherein the output signal is outputted based on a power consumption measured inside the semiconductor integrated circuit.

18. The data processing device according to claim 15, wherein the further operating state is an operating state that de-activates the semiconductor integrated circuit.

19. The data processing device according to claim 15, wherein the further operating state is an operating state of generating a signal that urges replacement of the board on which the semiconductor integrated circuit is mounted.

20. The data processing device according to claim 15, wherein the data processing device has a device for measuring a current of a power source supplied to the semiconductor integrated circuit, and generates the output signal by a change of the current.

21. The detection system according to claim 1, wherein, after the LSI switches from normal operation to low power operation, if the electric power is not decreasing, the output signal de-activates the LSI or urges replacement of the board on which the LSI is mounted.

22. The detection system according to claim 15, wherein the output signal is an alarm signal.

23. The detection system according to claim 15, wherein, after the LSI switches from normal operation to low power operation, if the electric power is not decreasing, the output signal de-activates the LSI or urges replacement of the board on which the LSI is mounted.

* * * * *